United States Patent [19]

Mukai

[11] 3,787,737

[45] Jan. 22, 1974

[54] HIGH SPEED/LOGIC CIRCUIT

[75] Inventor: Hisakazu Mukai, Tokyo, Japan

[73] Assignee: Nippon Telephone and Telephone Public Corporation, Tokyo, Japan

[22] Filed: Nov. 24, 1971

[21] Appl. No.: 201,667

Related U.S. Application Data

[63] Continuation-in-part of Ser. No. 826,317, May 21, 1969, abandoned.

[52] U.S. Cl. .................. 307/215, 307/208, 307/213, 307/214, 307/291, 307/297, 307/300

[51] Int. Cl.. H03k 19/08, H03k 19/34, H03k 19/30

[58] Field of Search ... 307/208, 213, 214, 215, 237, 307/218, 280, 241, 242, 300, 310, 296, 297; 330/30 D

[56] References Cited

UNITED STATES PATENTS

| | | | |
|---|---|---|---|
| 3,450,896 | 6/1969 | Taniguchi et al. | 307/208 X |
| 3,235,754 | 2/1966 | Buelow et al. | 307/213 X |
| 3,300,658 | 1/1967 | Slusher et al. | 307/297 |
| 3,259,761 | 7/1966 | Narud et al. | 307/215 |
| 3,381,232 | 4/1968 | Hoernes et al. | 307/218 X |
| 3,201,606 | 8/1965 | Mamon | 307/296 |
| 3,287,577 | 11/1966 | Hung et al. | 307/215 |
| 3,351,782 | 11/1967 | Narud et al. | 307/213 |
| 3,396,282 | 8/1968 | Sheng et al. | 307/215 X |
| 3,416,003 | 12/1968 | Walker | 307/218 X |
| 3,501,647 | 3/1970 | Giacomo | 307/215 X |
| 3,505,535 | 4/1970 | Cavaliere | 307/213 X |
| 3,548,294 | 12/1970 | Houghton | 307/297 X |
| 3,560,770 | 2/1971 | Gieles | 307/215 X |
| 3,573,488 | 4/1971 | Beelitz | 307/215 X |

OTHER PUBLICATIONS

Gardner, "Transistor Circuit," IBM Technical Disclosure Bull,; Vol. 8, No. 6. p. 919, 11/1965.
D'Agostino, "High Speed Logic Circuit," RCA Technical Notes; RCA TN No. 622, 3/1965.
Hurley, "Transistor Logic Circuits," Copyright 1961 by John Wiley & Sons, Inc.; FIG. 8.19 p. 244, A.U. 254.

*Primary Examiner*—John S. Heyman
*Assistant Examiner*—L. N. Anagnos
*Attorney, Agent, or Firm*—Watson, Cole, Grindle & Watson

[57] ABSTRACT

A high speed logic circuit comprising a plurality of unit gate circuits, wherein each transistor in the unit gate operates between cut-off and within an active region bounded by the saturation region of the gate transistor in response to first and second logic level input signals. Each transistor gate is connected in the common emitter configuration; the collector resistance is greater than the sum of the emitter series resistance and the incremental junction emitter resistance of the gate transistor with an input signal exceeding the base-to-emitter voltage of the gate transistor. The voltage source has a voltage which is insufficient for the gate transistor to which a first logic level signal is applied to be switched to an active state from a non-conducting state. Further, the collector current of the gate transistor is limited by the emitter series resistor when the second logic level signal is applied so that the collector junction thereof does not inject minority carriers. The potential difference between the voltage source terminals is defined by the formulas $$V_1 - V_2 < V_{BEI} + V_L$$

$$V_L < V_{BEI} - V_{CES}$$

wherein $V_1$ is the voltage at said first voltage source terminal and $V_2$ is the voltage at said second voltage source terminal, $V_{BEI}$ is the base to emitter forward voltage of said gate transistors, $V_L$ is the logic swing of said gate transistors, $V_{CES}$ is the collector-emitter saturation voltage of said gate transistors and wherein said collector series resistor and said emitter series resistor are defined by $$1 < R_C/R_E + r_e < V_{BEI} - V_{CES}/V_1 - V_2 - V_{BEI}$$

wherein $R_C$ and $R_E$ are said collector and emitter series resistors, respectively, and $r_e$ is said incremental emitter junction resistance value. The high speed logic circuit is formed by directly coupling the output terminals of each of said logic gates to the input terminals of other of said logic gates whereby the signal levels at each of said input and output terminals of each of said logic gates are maintained at substantially constant binary values. The operation of the gate circuit as defined by the above equations results in a very short propagation delay time, low power dissipation, and enables the individual gate circuits to be directly coupled without the need for intervening coupling circuits to maintain the binary signal level.

1 Claim, 22 Drawing Figures

FIG. 7
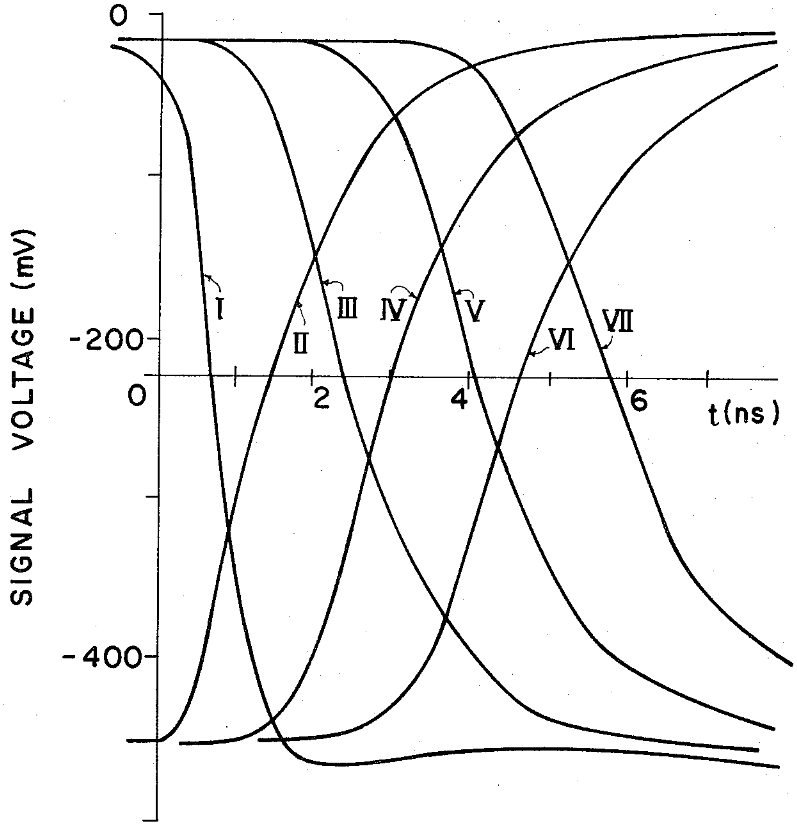
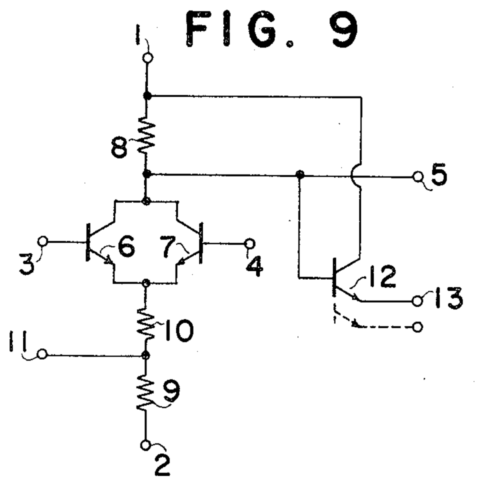
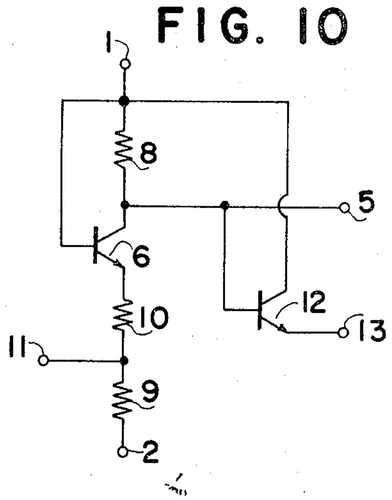

HIGH SPEED/LOGIC CIRCUIT

This application is a continuation-in-part application of Ser. No. 826,317, filed May 21, 1969, now abandoned.

This invention relates to high speed semiconductor logic circuits of low power consumption and more particularly to a logic circuit suitable for a large scale integrated circuit (which shall be abbreviated as LSI hereinafter) in which many circuits are integrated on a single semiconductor chip.

Recently, electronic devices show a trend to be smaller by the use of integrated circuits, and such trend is very important to lower the cost and further to increase the operating speed of such devices by reducing the signal propagation delay time.

However, when the apparatus is made smaller, the packing density of the circuit will increase and the method of dissipating the heat generated in the circuit will become a problem. Usually the power dissipation per unit circuit is larger in a high speed logic circuit than in a low speed logic circuit. It is all the more difficult in the high speed logic circuit to make the apparatus small. Particularly it is very difficult to produce LSI in which several hundreds of logic gates are integrated on a semiconductor chip of several $mm^2$, from the conventional high speed logic circuits.

As a method of reducing the power dissipation in a logic circuit without affecting the operating speed, the variation of the stored energy required for the logic operation has been minimized by reducing the stored energy in the circuit and to make the source voltage as low as possible.

Among already extensively used logic circuits are for example saturation mode logic using a common emitter transistor as an inverter, direct coupled transistor logic (DCTL), resistor transistor logic (RTL), diode transistor logic (DTL) or transistor transistor logic (TTL) and non-saturation mode logic such as emitter coupled logic (ECL) and complementary transistor logic (CTL). In saturation mode logic, as the saturated condition and cut-off condition of the inverter transistor, that is, the maximum condition and minimum condition of the stored energy are correspond to the ON and OFF conditions of the gate, the operating speed is inherently low.

On the other hand, in ECL circuits, as the current switch transistors having the function of logic gates operate in a perfectly non-saturated condition, the operating speed is very high.

FIG. 1 shows a circuit configuration of a conventional ECL circuit. $Q_1$, $Q_2$ and $Q_3$ are gate transistors. Input terminals $I_1$ and $I_2$ are provided at the bases of the gate transistors $Q_1$ and $Q_2$, respectively. A constant reference voltage Vref is applied to the base of the gate transistor $Q_3$. A constant current circuit I is connected with an emitter of the gate transistor. Thus the gate transistors $Q_1$, $Q_2$ and $Q_3$ and the constant current I form a current switch circuit. The voltages obtained across resistors $R_1$ and $R_2$ are taken out as output signals at output terminals $O_1$ and $O_2$ through emitter follower transistors $Q_4$ and $Q_5$, respectively. FIG. 2 shows the transfer characteristic of the direct current voltage of the above mentioned circuit by using the voltage $V_{EE}$ in FIG. 1 as a reference voltage. When the input voltage becomes so high as to approach the value of the constant reference voltage Vref, the current will be switched between the gate transistors $Q_1$ or $Q_2$ and $Q_3$. The current will be switched when the input voltage is between the voltages $V_{TL}$ and $V_{TH}$ in FIG. 2. That is, the current will be switched from the gate transistor $Q_3$ to the gate transistor $Q_1$ or $Q_2$ within a voltage range of the voltages $V_{TL}$ and $V_{TH}$. The gradient of the DC characteristics in the transition region is very sharp, because it is determined by the voltage gain of the transistor having a grounded base circuit configuration. The voltage difference between $V_{TL}$ and $V_{TH}$ is determined by the variation in the current of the base-emitter forward voltage of the gate transistors $Q_1$ or $Q_2$ and $Q_3$ which is approximately 100 to 200 mV. Except in this region, the output voltage does not depend so much on the input voltage. The logic 0 level and 1 level ($V_L$ and $V_H$) are determined to be in such region. In the region of the input voltages $V_{IL}$ and $V_{TL}$ and the region of $V_{IH}$ and $V_{TH}$, even if the input voltage is varied and the logic 0 level and 1 level can be discriminated. $V_{TL}$ and $V_{TH}$ are lower and upper limits of the threshold, respectively, for distinguishing the input signal level 0 from level 1. Further, the difference voltages $(V_{IL} - V_{TL})$ and $(V_{IH} - V_{TH})$ represent the noise margin. Thus ECL circuitry has a propagation delay threshold characteristic for the voltage transfer characteristic and operates as a logic gate having sufficient noise margin. As the transistor is not in a saturated state, this current switch circuit operates it at a very high speed.

However, ECL circuitry has a defect in that the power consumption can not be reduced. First, the constant current circuit I requires a large voltage and consumes unnecessary electric power. Further, whether the gate is ON or OFF, the total current of that gate will be the same and the power consumption will be high. The constant voltage circuit providing the reference voltage Vref and the emitter follower transistor circuit in FIG. 1 also consume electric power. Thus the power consumption of conventional circuitry is very high.

The complementary transistor logic (CTL) is a type of emitter follower logic and therein a gate is formed by connecting in cascade an emitter follower circuit formed of PNP transistors and an emitter follower circuit formed of a NPN transistor. The transistor emitter follower circuit configuration operates at a very high speed. However, the emitter follower circuit has a voltage gain essentially less than 1. If many of these circuits are connected, the signal level will attenuate. In other words, this circuit has no noise margin. Therefore, there is the defect that more than several stages of emitter follower circuits can not be connected in cascade.

The purpose of the present invention is not only to improve such defects of conventional logic circuits as are mentioned above but also to provide a logic circuit based on a new operating principle. The logic circuit has very high operating speed and very small power dissipation.

An object of the present invention is to provide a logic circuit of high speed and low power consumption.

Another object of the present invention is to provide a logic circuit composed of very single unit gate circuits.

An object of the present invention is to provide a logic circuit of high speed most adaptable to LSI.

The present invention is based on a new operating principle for a logic circuit such that each unit gate, with respect to the logic current, has no threshold in the d.c.-voltage transfer characteristic as explained hereinafter but, when many gates are combined to form a logic circuit, the group of the gates will have a threshold in its transfer characteristics and operates with a binary logic level.

The features of the circuit configuration of the present invention are first that it comprises simple unit gates formed of a plurality of inverter gate transistors and resistors connected in series respectively with the gate transistors emitters and collectors. The gradient of the linear region of the transfer characteristic of the direct current voltage between the input and output is set to a value larger than one by making the collector series resistance larger than the emitter series resistance. The electric source voltage with which the emitter series resistors are connected is so determined that the difference from the potential of the logic 0 of the input signal may be smaller than the base-emitter forward voltage of the transistor. Therefore the transfer characteristic of the direct current voltage is substantially linear between the input 1 level and 0 level but becomes rather non-linear near the 0 level. By connecting many of such gates, an assembly of gates performs a logic operation while automatically maintaining a specific logic level.

In the accompanying drawings:

FIGS. 7 and 8 are diagrams for explaining characteristics of the circuit of the present invention.

FIGS. 9, 10, 11, 12, 13 and 14 are diagrams showing embodiments of logic circuits using the logic gates of the present invention.

Figure 3:
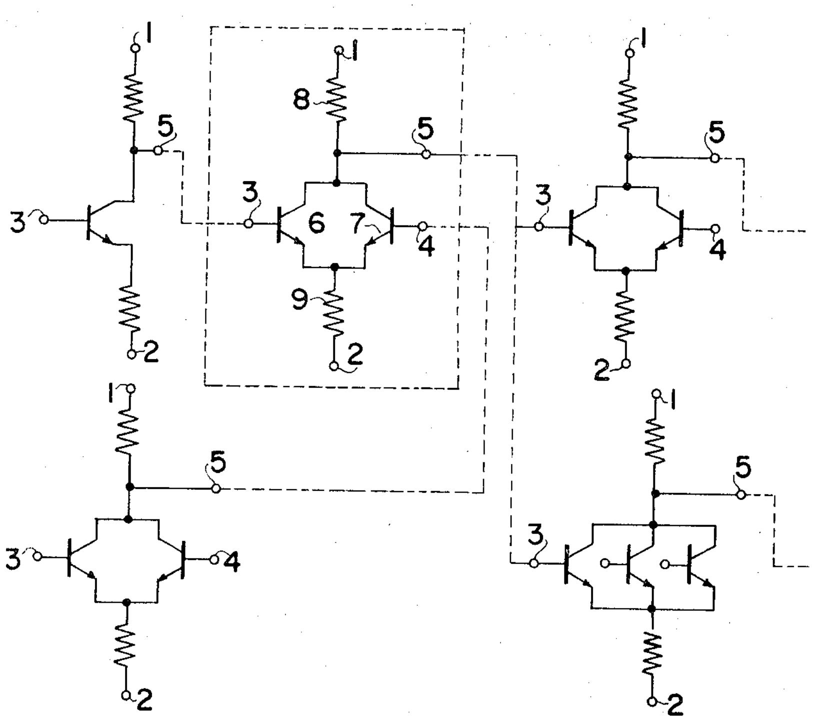
FIG. 3 is a diagram showing a fundamental circuit connection of a logic circuit of the present invention.

The structure and operating principle of the present invention shall be explained in detail with reference to specific embodiments in the following description. Further, in the following explanation, an NPN type transistor is used as an example but it is evident that even a PNP type transistor can be used. FIG. 3 shows a basic circuit configuration of the present invention wherein, the part enclosed with the dotted line is a logic gate. 1 and 2 are respectively + and − electric source terminals and such condition as is described later is given to the potential difference between them. 3 and 4 are input terminals. 5 is an output terminal. 6 and 7 are gate transistors. The NOR logic function of the two inputs applied to the terminals 3 and 4 is performed by connecting the emitters and collectors of both transistors respectively in common. 8 and 9 are resistors to determine the operating level of the gate transistors and the logic level of the gate circuit and the resistance ratio $R_8/R_9$ is selected larger than one so that the slope of the DC voltage transfer characteristics may be a little larger than one. In the diagram is shown an example of a method of connecting logic gates with each other.

Figure 6:
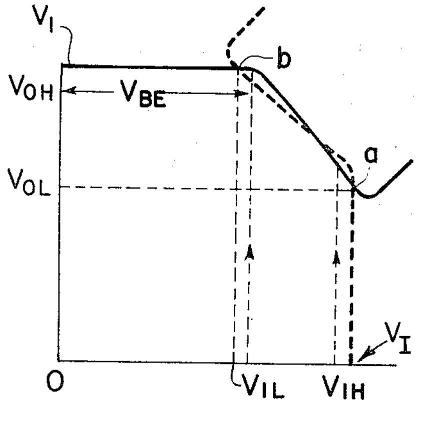
FIGS. 4, 5 and 6 are diagrams for explaining the operating principle of the circuit of the present invention.
Figure 4:
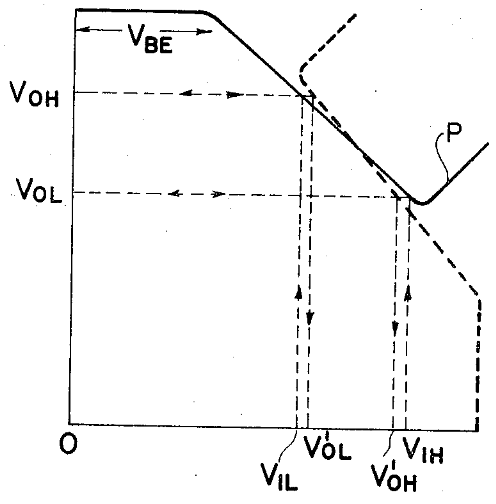
Figure 5:
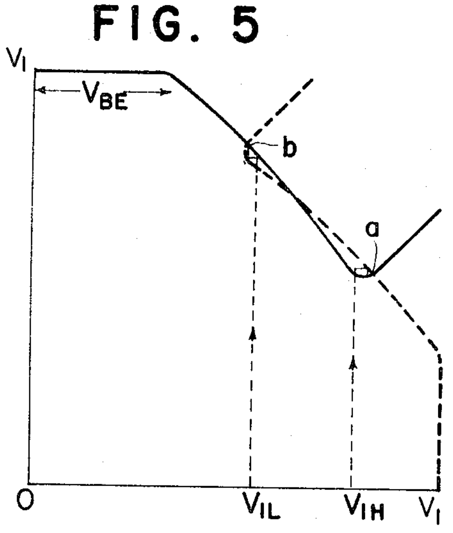

FIGS. 4, 5 and 6 explain the logic operation of the basic circuit in FIG. 3. Each figure shows an input-output DC voltage transfer characteristic curve. For the solid line, the abscissa represents the input voltage and the ordinate represents the output voltage. The broken line shows the relation between the input voltage and output voltage of the following gate, and for the broken line the abscissa represents the output voltage and the ordinate represents the input voltage. Further, the potential of the source terminal 2 in FIG. 3 is taken as an origin. When the voltage applied to the input terminal 3 is gradually increased from zero until its value becomes higher than the base-emitter forward voltage $V_{BE}$ of the transistor 6, the transistor 6 will begin to operate. When the input voltage is higher than that voltage, the transistor 6 will feed an electric current to the resistor 9. This current flows mostly through the resistor 8 and, with its voltage drop, the voltage of the output terminal 5 begins to drop. In the input-output transfer characteristic curve, in such case, with the increase of the input voltage, the output voltage reduces substantially linearly. When the input voltage becomes higher than that of point P the emitter-collector voltage of the gate transistor will become close to zero and the gate transistor will enter the saturated condition, and with further increase of the input voltage, the output voltage will also increase. FIG. 4 is the case where $R_8/R_9$ is substantially one, FIG. 5 is the case where $R_8/R_9$ is a little larger than one but the source voltage is too high and, in either case, the circuit operation which is the object of the present invention is not obtained. FIG. 6 is the case where $R_8/R_9$ is larger than one, and the source voltage is specially determined and the circuit operation of this invention is carried out properly.

In FIG. 4, as the ratio R8/R7 is nearly equal to one and the voltage gain of the input-output characteristic (that is the slope of the characteristic curve) is a little smaller than one because of the loss due to the resistance of the gate transistor emitter junction, when either $V_{IH}$ as a logic 1 level or $V_{IL}$ as a logic 0 level is applied to the input terminal of the first gate in a chain of gates, the output voltage will become respectively $V_{oL}$ or $V_{oH}$. These voltages are in turn the input voltages of the 2nd gate connected with the first gate, the transfer characteristic of which is shown by the dotted line in FIG. 4. The output voltage of the second gate is respectively $V'_{oL}$ and $V'_{oH}$. Thus, the input logic swing ($V_{IH} - V_{IL}$) is attenuated to ($V'_{oH} - V'_{oL}$) for two stages of gates. If a logic circuit block is assembled of such gates, the logic level will not be able to be held, and logic signal will be lost.

These features just resemble those of the conventional emitter follower logic in which each gate consists of two emitter follower transistor circuits of a PNP transistor circuit and NPN transistor circuit. Such gate has no function of regenerating a logic signal level and has no noise margin. Therefore, it is difficult to connect more than several stages of such gates in cascade.

However, the limiting point of convergence of the logic levels a and b in such case is the intersection of the linear portion in which the voltage gain is larger than 1 and the non-linear portion in which the gain has been reduced by saturation of the gate transistor as shown by the transfer characteristics FIGS. 4 to 6.

FIG. 6 represents the case where a condition shown by equation (1), is added to the source voltage $V_1$-$V_2$ in FIG. 5 and each gate operates in a new mode intended in the present invention. The limiting point of convergence of the logic levels a and b in such case is the intersection of the linear portion in which the voltage gain is larger than one and the non-linear region in which the base input current has reduced, the gate transistor enters the cut off region, and the voltage gain has begun to reduce to be smaller than one in the transfer characteristics. In the OFF state, the operating region of the gate transistor is just on the boundary of the active range and cut-off region. In the ON state, the operating region of the gate transistor is in a half saturated region in which a forward bias voltage is applied to the collector junction but is still in a slightly saturated condition before the injection of minority curriers in the collector junction occurs and therefore the cut-off frequency $f_T$ of the transistor does not reduce too much. Therefore, the input signal level is varied from $V_{IL}$ to $V_{IH}$ or vice versa and the transfer of the operating point of each gate from the point *a* to the point *b* in FIG. 6 or vice versa is effected at very high speed.

In order that the logic gate may operate in such mode as is described above, it is necessary that the difference between the input signal potential $V_{IL}$ of the logic 0 level and the source potential given to the voltage source terminal 2 should be a voltage smaller than the base-emitter forward voltage $V_{BE}$ of the gate transistor and the gate transistor should be in a state just out of active region.

For that purpose, the value of the source voltage ($V_1 - V_2$) must substantially satisfy the following condition:

$$V_1 - V_2 < V_{BEI} + V_L \quad (1)$$

wherein $V_1$ is a potential of the source terminal 1 and $V_2$ is that of the terminal 2, $V_{BEI}$ is a base-emitter forward voltage of the gate transistor in the ON state and $V_L$ is a logic swing and must satisfy the following condition:

$$V_L < V_{BEI} - V_{CES} \quad (2)$$

wherein $V_{CES}$ is a collector-emitter saturation voltage (a voltage when the injection of minority carriers begins to occur at the collector junction).

Further, for the resistances $R_8$ and $R_9$, the following condition is required:

$$1 < R_8/R_9 + V_e < V_{BEI} - V_{CES}/V_1 - V_2 - V_{BEI} \quad (3)$$

wherein $\gamma_e$ is an incremental resistance value of the emitter junction.

If the source voltage and resistance value are selected as above, the group of the basic unit gates in FIG. 3 will have two optimum limiting points of convergence shown as the points *a* and *b* in FIG. 6. That is, if these two levels are logic levels, the entire circuit will logically operate between them while holding the same logic level swing. In an integrated circuit using crystals of silicon, $V_{BEI}$ is about 0.75 − 0.85 V. By selecting $V_2 = OV$ and $V_1 = 1.10 - 1.15$ V the high logic level $V_{IH} = V_{OH}$ becomes about 1.05 − 1.15 V and the low logic level $V_{IL} = V_{OL}$ becomes about 0.55 = 0.75 V. If a noise is induced in the input terminal of one gate, each gate subsequently connected to that one gate will attenuate the noise and will be capable of slightly restoring the output level to a correct logic level.

The circuit operation of the present invention described above is essentially different from the conventional ECL and emitter follower logic circuits as will be apparent from the following description.

Figure 1:
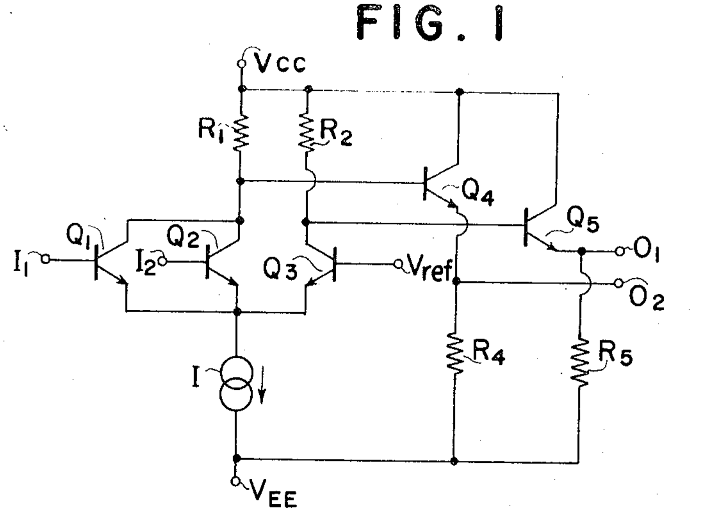
FIG. 1 shows an example of a circuit configuration of a conventional high speed logic circuit.
Figure 2:
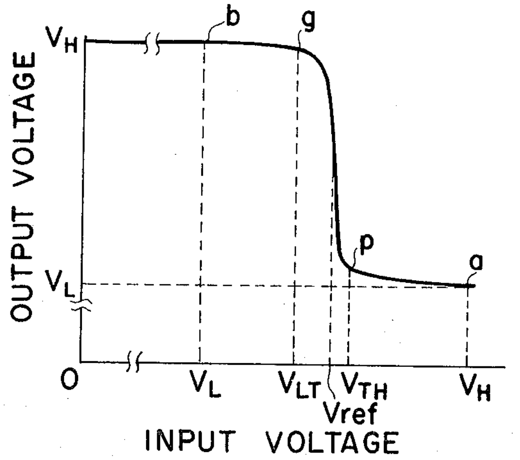
FIG. 2 is a diagram showing the characteristics of the above mentioned conventional high speed logic circuit.

In each gate of an ECL circuit, the switch between the output 0 level and 1 level is made with a current of the gate transistor, and such a threshold characteristic which distinguishes the logic 0 and 1 levels in spite of some input noise as is explained in FIG. 2 is obtained. Further, the output 0 level and 1 level are determined by the current value of the constant current circuit I (which may be formed only of resistors) in FIG. 1 and the values of the collector series resistance $R_1$ or $R_2$.

Whereas, in the circuit of the present invention, as explained in FIG. 6, the change between the output 0 level and 1 level is made by the variation of the current within the resistor 9 corresponding to the input voltage. That is, comparing the operation of the logic gate of this invention with the conventional ECL logic gate (reference FIG. 2), the logic gate of this invention does not require that portion of the voltage equivalent to $V_{LT} - V_L$ in the input signal when the gate transistor is switched from its low level output to its high level output. Similarly, the transistor gate of the present invention does not require that portion of the voltage equivalent to $V_H - V_{TH}$ in the input signal when the gate transistor is switched from its high level output to its low level output. This is the meaning and definition of the terminology, such as, "no threshold in the D.C. voltage transfer characteristic" used throughout the specification. Therefore, there is no sharp threshold delay in the transfer DC voltage characteristic of each gate. The logic 0 level and 1 level are established with the points *a* and *b* in FIG. 6 determined by the values of the source voltage and the resistances $R_8$ and $R_9$ satisfying the conditions of the formulas (1) and (3), respectively.

In emitter follower logic circuitry, each gate has no capability of regenerating a logic level and therefore no noise margin at all. Therefore, its application is remarkably limited. Whereas, in the circuit of the present invention, each gate has a weak capability of regnerating a logic level and therefore has a small noise margin. When many gates are grouped, the gates will have a sufficient capability of regenerating a logic level and noise margin. Thus the present invention is based on a new operating principle quite different from that of a conventional logic circuit.

Now the features of the present invention shall be explained.

1. First of all, in the gate of the present invention, the electric power consumption reduces by one order of magnitude compared with that of the conventional high speed logic circuit. The power consumption of the gate of the conventional ECL circuit shown in FIG. 1 shall be calculated as an example. In most cases, the constant current circuit I is formed by only a resistance. In such a case, it will be required that the voltage $V_I$ across resistance $R_I$ of the constant current circuit should be much larger than the logic swing $V_L$ so that the current of circuit I may not vary so much with the variation of the input voltage. Further, the base-emitter forward voltage drop of the emitter follower transistor should be considered in the circuit of FIG. 1. The required source voltage ($V_{CC} - V_{EE}$) is given by the following formula $$(V_{CC} - V_{EE}) = 2\ V_{BE} + V_I$$

In the conventional circuit, generally, in order to obtain a constant current characteristic, the voltage $V_I$ is made more than several times (for example, about 4 times) as large as the logic swing $V_L$. If $V_L \approx 800$ mV and $V_I \approx 3.4$ V, $V_{CC} - V_{EE} = 5$ V. The conventional ECL circuit operates mostly from such a source voltage. Now, if the constant current $I = 3$ mA, the power consumption of the current switch circuit will be 15 mW. Even in case the current of the emitter follower circuit is small, it will be required to be about one-half of the current of the current switch per output. That is to say, even if the current is designed to be small, it will be required to be about 22.5 mW/gate. In the present commercial ECL, the current is generally 30 to 60 mW.

In comparison therewith, in the gate of the circuit of the present invention, the voltage $V_I$ across the emitter junction resistance is smaller than the logic swing $V_L$ (because the resistance ratio $R_8/R_9 > 1$). Moreover, $V_L$ is of a value of about 0.4 to 0.5 V as shown in the formula (2) and therefore $V_I = 0.3$ to 0.4 V. From the formula (1), the source voltage ($V_1 - V_2$) is about 1.1 to 1.2 V. Now, in the gate of the circuit of the present invention, when it is OFF, no current will flow. Therefore, if the ON current is 3 mA the same as in the above described ECL, in the average of ON and OFF, a current of 1.5 mA will flow. The average power consumption will be 1,5 mA × 1.1 $V = 1.65$ mV per gate.

As in the above, the power consumption of the present invention will be greatly improved because of the facts that the power consumption in the constant current circuit is reduced as compared with that of the conventional high speed logic ECL circuit of the same kind, and because there is no current when the gate is OFF and there is no power consumption in an emitter follower circuit.

2. Each gate of the present invention operates at a very high speed. As in each gate, the transistor operates almost in the active region, it is needless to say that the speed of these gates is much higher than that of such saturation mode logic gates as TTL and DTL. Further, it operates at a higher speed than the above described ECL circuit which rises much electric power.

This is for the following reasons. In an ECL circuit the operating point of the gate is at the point *a* or *b* in FIG. 2. And before the gate is switched, it is necessary that the input voltage should vary to $V_{TH}$ or $V_{LT}$ and the operating point of the gate should move to *p* or *q*. When the input voltage further varies from this operating point, the output voltage will vary. On the other hand, in the circuit of the present invention, in the normal state, the operating point is at the point *a* or *b* in FIG. 6 and, as soon as the input voltage varies, the output voltage will vary. Therefore, the response of the output voltage variation to the variation of the input voltage will be very fast. This shall be explained with the operating point of the gate transistor. In the ECL circuit, at the point *b*, the gate transistor $Q_1$ or $Q_2$ in FIG. 1 will be in a perfect cut-off state and the emitter junction capitance will be in a state in which the electric charge is discharged. In order that the gate transistor $Q_1$ or $Q_2$ may become conductive and turn to the ON state, at first emitter junction capacitance of $Q_1$ or $Q_2$ must be charged up to the voltage value required for carrier injection by the input signal. Now, in the gate of the present invention, at the point b in FIG. 6, the emitter junction of the gate transistor will have been already charged to that point just before carrier injection. Therefore, in the circuit of the present invention, there is substantially no delay time until the transistor begins to operate when the input signal comes in and a high speed operation becomes possible.

Figure 8:
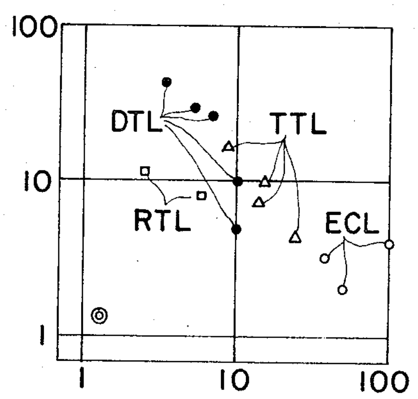

FIG. 7 shows the output wave forms of the gates shown in FIG. 3. Waveforms I, II, ... V correspond to the outputs of gates I, II, ... V. The transistor has a cut off frequency $f\alpha = 1$ $GH_Z$. $R_8$ is 150Ω and $R_9$ is 100Ω. A parasitic capacitance of about 10 pF is added between the emitter of the gate transistor and the ground. This parasitic capacitance is to accompany the structure of the later described integrated circuit and is effective in the improvement of the operating speed. The waveform in each stage in FIG. 7 shows that, when the input voltage in each stage begins to vary, before the voltage reaches the center value of the logic swing, the output voltage will have already begun to vary. Thus the response of this circuit is fast. The delay time is less than 1 ns per stage. In an ECL circuit using a transistor of about the same characteristic, the delay time will be 1.5 ns. The power consumption and the propagation delay time per gate in the above described circuit of the present invention are compared with those of another commercial logic gate as in FIG. 8.

3. In the circuit of the present invention, the circuit configuration of each gate is very simple. This is evident even by comparing the unit circuit in FIG. 3 and the circuit in FIG. 1 with each other. In the ECL circuit in FIG. 1, further a constant voltage circuit to provide a constant reference voltage Vref to the base of the gate transistor $Q_3$ is required. In the circuit of the present invention in which the circuit configuration is simple, as explained later with its integrated circuit structure in FIG. 16, the area occupied by one gate on the semiconductor crystal surface can be made small and it is possible to integrate more gates on the same crystal. This is a point very advantageous to making LSI circuits.

4. The circuit of the present invention has a feature that, as the waveforms are shown in FIG. 7, the propagation delay time is very short but the rise time and fall time are a little longer than it. This is a very different property compared with the ECL circuit having a threshold characteristic and an emitter follower output circuit. In general induced noise level is proportional to rise time and fall time of noise source. The circuit of the present invention can be said to be an ideal circuit having little noise while operating at a very high speed.

As in above the logic circuit of the present invention is very different from any conventional logic circuit in the operating speed, power dissipation and easiness of manufacturing.

There are many various modified gates of the basic gate shown in FIG. 3. These modified gates are used as combined with the basic gates to make it possible to improve the characteristics of the entire logic circuit and to save the number of the elements.

FIG. 9 shows an embodiment of the modified gate. In this modified gate, the resistance 9 of the basic gate in FIG. 3 is divided into two parts 9 and 10 and an input terminal 11 is provided between them.

Here, the level of the logic signal applied to the input terminals 3 and 4 is the same as the logic signal level of the basic gates, while the level of the logic signal applied to the input terminal 11 is shifted once by the base-emitter forward voltage from the logic signal level of the basic gates. Further, an output terminal 13 is provided at the emitter of the emitter follower transistor 12. The output logic signal level obtained at the terminal 13 is a level shifted by the base-emitter forward voltage from the signal level of the basic gates obtained at the terminal 5. By using this modified gate in combination with the basic gates, the logic circuit operates at two binary logic levels, namely the basic logic levels for the basic gates and the logic levels shifted by the base-emitter forward voltage from the basic levels.

When logic inputs A, B and C are applied respectively to the input terminals 3, 4 and 11, there will be a relation represented by the formula $\overline{(A + B)\,\overline{C}} = X$ wherein X is the logic output of the output terminal 5 or 13. That is to say, even in a state that the 1 level potential is applied to the input terminal 3 or 4, when the level of the input terminal 11 rises, the potential difference across resistance 10 will reduce and the electric current flowing through resistance 10 will reduce. Therefore, the current flowing through the resistance 8 will also reduce and the potentials of the output terminals 5 and 13 will also rise to reach the 1 level. However, in case where the potential applied to the input terminal 11 falls, if the logic 1 level signal is applied to the input terminal 3 or 4, the current flowing through the resistor 10 will be gradually increased until it equals the current flowing through the resistor 9. The current flowing through the resistor 10 flows to the resistor 8 to lower the potentials of the output terminals 5 and 13 to the logic 0 level. The input terminal 11 is driven by the emitter follower transistor in the preceding stage. Therefore, if the currents flowing through the resistors 9 and 10 are equal to each other, current will not flow from the input terminal 11 of the emitter follower transistor and the emitter follower transistor will be cut off so that the level of the input terminal 11 will not decrease further.

If the potential applied to the input terminal 3 or 4 is the logic 0 level, the current will not flow through the resistor 10 and the resistor 8 even though the potential applied to the input terminal 11 is lowered. Therefore, the output will not become a low level and the logic 1 level will be maintained. The transfer characteristics between the input terminals 3 and 4 and the output terminals 5 are exactly the same as that of the basic gate circuit in FIG. 3. The effect of using the shifted logic level is that the logic function of the gate will be thereby multiplied. The output terminal 5 can be connected simultaneously to the input terminals of a plurality of gates in the following stage but the output terminals 5 of a plurality of gates can not be connected in common. On the other hand, the output terminal 13 can be connected in common with the output terminal 13 of another gate circuit and can be connected to the input of the following stage. That is to say, by only connecting the output terminal 13 with the output terminal 13 of another gate, the OR logic function can be carried out. Further, if a plurality of emitters of the emitter follower connected transistor 12 are provided as shown by the dotted line in FIG. 9, it will be possible to take a plurality of independent outputs of the same gate.

Figure 11:
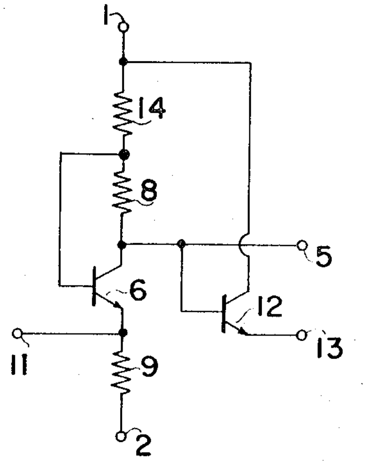

In the modified gate circuit in FIG. 9, when only the terminal 11 is to be used as an input terminal, that is, when only the shifted logic level is used as an input, it will be necessary to add the 1 level input to the base 3 of the inverter transistor 6. FIGS. 10 and 11 show methods of carrying it out simply.

In the circuit in FIG. 10, the base of the inverter transistor 6 of the modified gate is connected to the source terminal 1. The operation of the gate circuit shown in FIG. 10 is exactly the same as the operation in the state wherein the signal of the logic 1 level is applied to the input terminal 3 in the gate circuit shown in FIG. 9. The transfer characteristics between the input terminal 11 and the output terminal 5 or 13 are exactly the same as those in the gate circuit shown in FIG. 9. Further, the function of the gate circuit shown in FIG. 10 is exactly the same as the function for the case where only the input terminal 11 of the gate circuit shown in FIG. 9 is used as an input terminal. In the circuit in FIG. 11, the base of the transistor 6 is connected between the resistances 14 and 8 connected between the collector and source terminal 1. The function of this circuit is exactly the same as of the circuit in FIG. 10. To the input terminal 11 is applied level shifted logic signal. When the input is the 0 level, the transistor 6 will operate with a part of the current flowing through the resistance 14. The potentials of the base and emitter of the transistor 6 at this time are determined by the ratio of the resistance 14 to 9. The output 0 level is determined by further selecting the ratio of the resistance 14 to 8. When the input potential is gradually elevated to exceed the emitter potential of the transistor 6 determined by the ratio of the above mentioned resistances, due to the inflow current from the input terminal 11, the operating current of the transistor 6 and therefore the currents of the resistances 14 and 8 will decrease and the output level will vary toward the 1 level. In this circuit, among the resistances 8, 9 and 14, there is the following relation:

$$\text{(Output logic swing)} = (V_1 - V_2 - V_{BEI}) \times R_8/R_{14} - 1/R_9/R_{14} - 1$$

Further, if $(V_1 - V_2) < V_{BEI} +$ (logic swing), the gate in FIG. 11 will be also able to be connected with the other above mentioned gate in the same manner as the gate in FIG. 10 to form a logic circuit.

Figure 12:
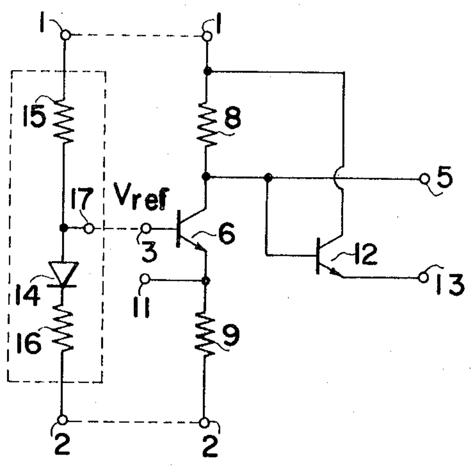

Each of the above described gates is a circuit which has a linear input — output voltage characteristic and has no threashold voltage. And their ability of determining a logic level and wave re-shaping is rather week. Therefore, in case there is so much noise induction that the logic level is likely to fluctuate, threshold logic gates which hae the threshold voltage in their input — output voltage transfer characteristic are preferably used in combination with the above mentioned gate circuits which have no critical threshold. In FIG. 12, a constant voltage feeding circuit is added to the modified gate shown in FIG. 9 so that a threshold characteristic may be given. Then the circuit in FIG. 12 has a strong potential to regenerate the logic level and to reshape the waveform. The input terminal 3 of the modified gate is connected to the output terminal 17 of a constant voltage feeding circuit enclosed with the dotted line. The logic input terminal of this circuit is 11 to which is connected the level shifted logic signal output of a preceeding gate. The ratio of the resistance 8 to 9 is of a value which is about twice as large as the ratio of the resistance 8 to 9 of the basic gate and the resistances 15 and 16 are of substantially the same value. The diode 14 is added to vary the output voltage of the constant voltage feeding circuit together with the fluctuation of the logic level with the temperature variation and source voltage variation.

In this circuit, depending on whether the base potential of the emitter follower transistor 12 of the output in the preceding stage is larger or smaller than the base potential $V_{ref}$ of the transistor 6, the transistor 6 is distinctly distinguished to be in the OFF state or ON state. That is to say, this circuit shows a characteristic of having a threshold voltage. When the voltage between the source terminals 1 and 2 is made to be of a value a little lower than $\{V_{BE1} + (\text{logic swing})\}$ and the values of the resistances 8 and 9 are determined to be as described above, this circuit can be connected with other gates circuit and can work so as to maintain the normal logic operation of the group of these gates. By connecting a plurality of preceding stage outputs of shifted level to the input terminal, the gate performs OR logic function.

Figure 13:
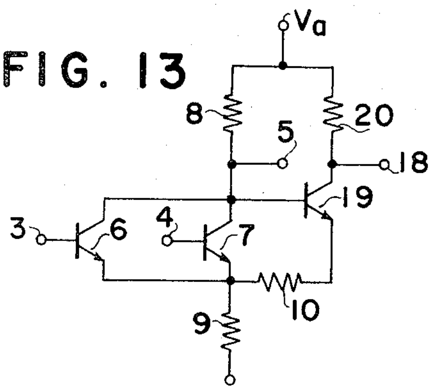

A modified gate which can be used in combination with the present invention and has a stronger wave reshaping function is the Schmitt trigger circuit shown in FIG. 13. With the logic signals applied to the input terminals 3 and 4, there will appear a NOR output at the output terminal 5 and an OR output at the output terminal 18. The threshold voltage is determined by the ratio of the resistances 9 to 10.

Figure 14:
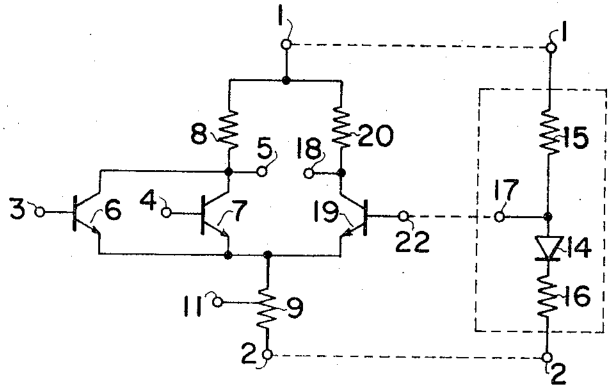

FIG. 14 shows another modified gate which can be used in combination with the present invention. In this circuit, for the input signal of the input terminal 3 and 4, there are obtained a logic NOR output at the output terminal 5 and a logic OR output at the output terminal 18. A level-shifted signal is applied to the input terminal 11 and, with this signal, the transistors 6, 7 and 19 can be made to be in the OFF state irrespective of the input signals of the input terminals 3 and 4.

The circuit configuration in FIG. 14 resembles that of a conventional current switch circuit. If the value of the resistor 9 is made a value sufficiently larger than the value of the resistor 8 and the value of the source voltage given between the electric source terminals 1 and 2 is made larger than that of the source voltage given to the basic gates in FIG. 1, the circuit in FIG. 14 will operate as a general current switch circuit. In such case, as the input and output voltage characteristic has a sufficient threshold characteristic, if this circuit is used as connected with basic gates, the noise margin will be able to be made larger than in the case of forming large logic circuits with only basic gates. However, there will be a defect that the power consumption of this current switch will become larger.

Figure 15:
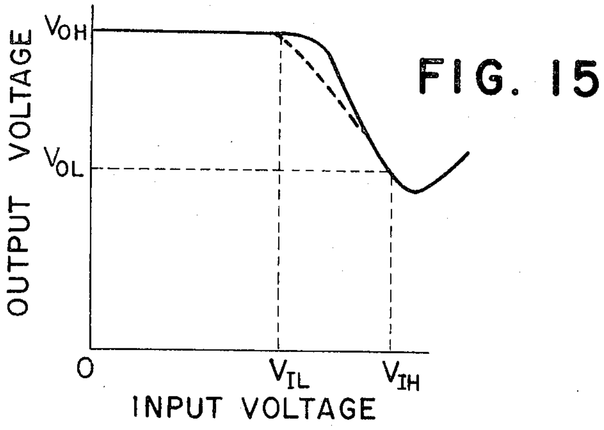
FIG. 15 is a diagram for explaining the operation of an embodiment of a gate used in the logic circuit of the present invention.

There is a method wherein the circuit configuration in FIG. 14 is made to perform an operation quite different from that of the conventional current switch circuit and is made to have a characteristic close to that of the basic gate shown in FIG. 3. In such case, the relation between the values of the resistances 8 and 9 and the current source voltage are made the same as of the basic gate in FIG. 3. That is to say, the value of the resistance 8 is made larger than the value of the resistance 9 and a source voltage satisfying the condition of the formula (1) is fed to the voltage source terminals 1 and 2. Then, the output terminal 5 of the circuit in FIG. 14 will show a characteristic resembling that of the above described base gate and the output terminal 18 will show the same characteristic as of the above described modified gate in FIG. 12. The transfer characteristic between the input terminal 3 or 4 and the output terminal 5 will be as shown in FIG. 15. In the diagram, the dotted line shows the characteristic of the basic gate shown in FIG. 6. The characteristic on the logic 1 side having a high input voltage is the same as the characteristic of the basic gate and has a gradient determined by the ratio of the resistors 8 and 9. In FIG. 15, $V_{IL}$ and $V_{IH}$ are the low level and high level of the input, respectively, and $V_{oH}$ and $V_{oL}$ are the high level and low level of the output, respectively. On the logic 0 side low in the input voltage, an electric current flows into the resistor 9 from the transistor 19 and the transistor 6 or 7 enters a perfect cut-off state more deeply than in the case of the basic gate shown by the dotted line. Therefore, when the input 0 level potential is shifted a little, for example by noise, transistor 6 or 7 is kept in a non-conducting state until the potential reaches some intermediate level. If the input potential is shifted farther toward the 1 level, the output decreases at first steeply and then with some gradient similar to the dotted line. That is to say, it will have a weak threshold characteristic on the 0 level side. Therefore, even if the input signal 0 level is of a somewhat deviated value, the output 1 level will be definitely held. That is to say, by this circuit, the faculty of regenerating the logic signal level can be strengthened. Further, when this circuit in FIG. 14 is connected in a cascade of 2 to 3 stages, it will come to have a considerably good threshold characteristic for either of the input 0 level and 1 level.

When the resistance value and the feeding source voltage are selected to be of specific values as mentioned above the resistor 9 will lose the function of a constant current circuit, therefore the above circuit in FIG. 14 will be no longer a current switch circuit and will perform an operation resembling that of the basic gate and a circuit somewhat stronger in the capability of regenerating the logic level than the basic gate will be obtained. The formed modified gate can be operated with the same electric source by using the same resistor as of the basic gate. In other words, by using a master slice of the same semiconductor crystal and changing the wiring, either of the basic gate and modified gate can be formed. Therefore, both of them can be freely combined and used in LSI.

Each basic gate in FIG. 3 has no threshold characteristic but, when many gates are connected, the group of all the gates will have a threshold characteristic. When these gates are used within LSI, if the number of the connected stages within LSI is large, the circuit will have a threshold characteristic between the input and output of LSI. However, when the number of the connected stages of the gates is small, no sufficient threshold characteristic will be obtained. In case there is much noise induction outside LSI, it will be necessary to enlarge the noise margin with a definite threshold characteristic. In such case, a method wherein such gates having a little stronger threshold characteristic as that in FIG. 14 are used in output stage of LSI and its front stage will be effective.

Figure 16:
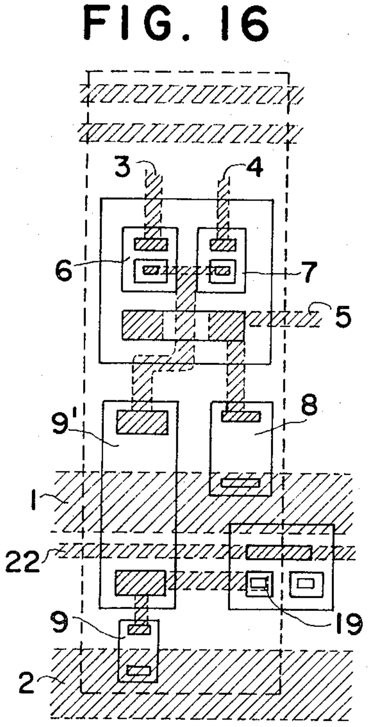
FIG. 16 is a view of an example of a structure of an integrated circuit for mounting a logic circuit of the present invention.

FIG. 16 shows an example of a circuit pattern on a semi-conductor chip surface of LSI using logic gates having no such threshold and logic gates having a weak threshold. The numerals in the drawing correspond respectively to those in FIG. 14. The hatched region represents the metal layer of the crystal surface. The region enclosed with dotted lines is unit cell. Many of such cells are arranged in the form of an array on the chip surface. Each cell consists of two input NOR gate elements. When the number of inputs is more than two the adjacent cell will be used. In the example in this drawing, the transistors 6 and 7 are formed in the same collector region. The transistor 19 has a base in common with the transistor 19 of the adjacent cell. By the way, this cell does not include the output terminal 18 in FIG. 14. In this embodiment, a resistance $R'_9$ is connected in series with the resistance $R_9$. The region of the resistance $R'_9$ is provided to cross the wiring with the electric source line 1 and is formed of a layer particularly high in its impurity concentration and low in its sheet resistance so that the resistance value may not be large. A comparatively large parasitic capacitance is added around the region of the resistance $R'_9$. This parasitic capacitance has effects of improving the high frequency characteristic of the transfer characteristic between the input terminals 3 and 4 and output terminal 5 of this gate and improving the operating speed. Whether the basic gate in FIG. 3 or in the modified gate in FIG. 14 is adopted is determined by whether the transistor 19 is connected with the resistance $R'_9$ or not. Thus, the basic gate of the present invention is very simple in the circuit formation and occupies only a small area of the chip surface. FIG. 3 and 14 can be respectively easily used with the same master slice.

In the above have been explained various kinds of gates to be the elements of the logic circuit of the present invention. They are all NOR or OR circuits.

Figure 17:
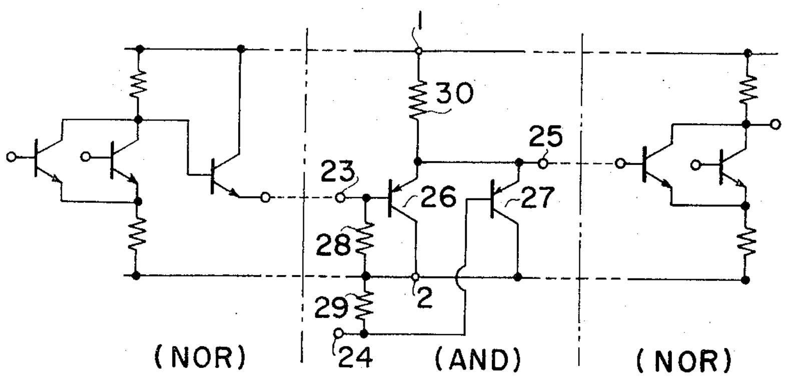
FIGS. 17, 18, 19, 20, 21 and 22 are diagrams showing logic circuits embodying the present invention.

Now, in case an AND circuit is required, a logic gate as shown in FIG. 17 can be used. In the Figure, transistors 26 and 27 are PNP transistors. The AND output for the level shifted input signal to the terminals 23 and 24 appears at the terminal 25 and becomes an input in the following stage. It is desirable that the resistances 28 and 29 are of values smaller than that of the resistance 30.

Figure 18:
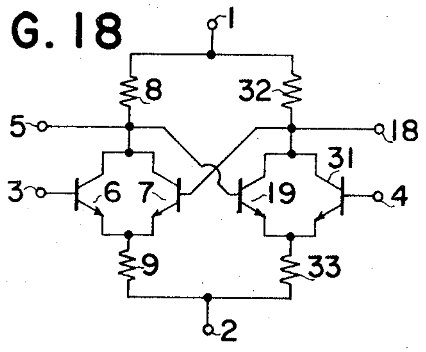
Figure 19:
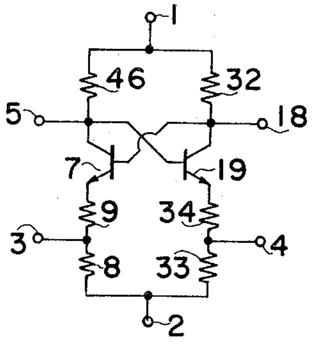

Embodiments in which a flip-flop is formed using the gates of the present invention are shown in FIGS. 18 and 19. In FIG. 18, two basic gates are combined, the terminals 3 and 4 are set and re-set terminals and the circuit is driven with the basic logic level, the transistor on the side to which is applied the 1 level becomes the ON state. The terminals 5 and 18 are output terminals. If the basic gate has the transfer characteristic shown in FIG. 6, information will be held in the bistable state at the point *a* or *b*. Further, if a part or all of the resistors 9 and 33 on the source terminal 2 side are made common, the sensitivity of the bistable operation of said flip-flop will be able to be somewhat reduced and accordingly the stability of said circuit will be able to be increased. In FIG. 19, two modified gate circuits are combined to make a flip-flop and the circuit is driven with the level shifted logic signal. In this circuit, the transistor on the side to which is applied the 1 level input switches to the OFF state.

The circuit of the present invention is characterised by making the source voltage small to the substantial limit for a circuit using a transistor to operate, for example, to be about 1 volt so that the power dissipation may be remarkably reduced.

However, the source voltage is thus so low that the operation of the circuit will be strongly influenced by the fluctuation of the source voltage. Further, when the characteristic of the transistor varies with the temperature fluctuation, in order to keep the operating region of the transistor optimum, it is necessary that the source voltage should also vary with the temperature. As a measure of it, a method wherein a source voltage regulator is included in each semiconductor chip for the logic circuit is adopted.

Figure 20:
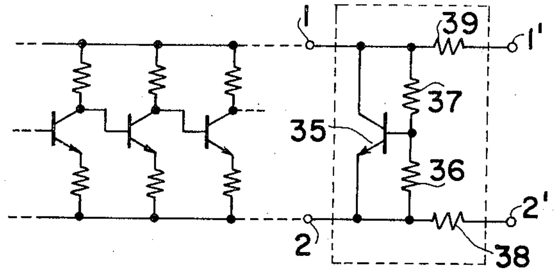

FIG. 20 is of an embodiment of the source voltage regulator in which the part enclosed with the dotted line is a regulator. 1′ and 2′ are external voltage source terminals and 1 and 2 are voltage source terminals for the logic circuit. When the outside source voltage fluctuates, the collector current of the transistor 35 will vary, the voltage drop at the resistor 38 and 39 (or at one of them) will vary to cancel the variation in the electric source and therefore the source voltage of the logic circuit, that is, the voltage between the terminals 1 and 2 will be kept constant.

The source voltage $(V_1 - V_2)$ of the logic circuit is given by the formula $(V_1 - V_2) = V_{BE}\,(R_{36} + R_{37}/R_{36})$ from the values $R_{36}$ and $R_{37}$ of the resistors 36 and 37.

Figure 21:
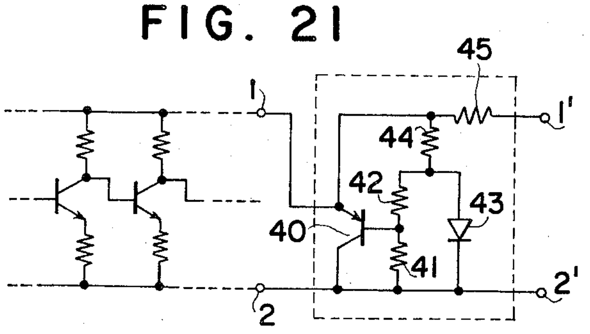

The circuit enclosed with the dotted line in FIG. 21 is a source voltage regulator formed by employing a PNP transistor. The source voltage of the logic circuit is determined by the sum of the base potential of the transistor 40 and its base-emitter forward voltage. In order to keep this value less than twice as large as the base-emitter forward voltage, the base of the transistor 40 is connected to a point of dividing the diode 43 with the resistors 41 and 42.

Figure 22:
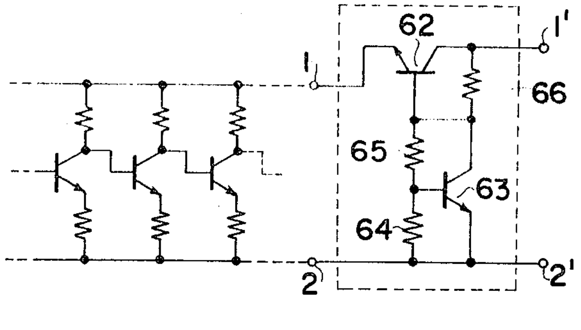

FIG. 22 shows still another source voltage regulator. In this circuit, the base potential of the transistor 62 is determined by the voltage between the base-emitter forward voltage of the transistor 63 and the ratio of the resistance 64 to 65. The potential of the source terminal 1 is the base potential of the transistor 62 minus the base-emitter forward voltage of the transistor 62. The function of the resistors 39 and 38 in FIG. 20 is assumed by the transistor 62 in FIG. 22.

The regulation of the source voltage of the logic circuit by the circuit in FIG. 20, 21 or 22 is proportional to base-emitter forward voltage of a transistor and the variation rate of the source voltage by temperature is proportional to that of the voltage $V_{BE}$ base emitter forward voltage of the transistor. Therefore, in the gates connected to it, the logic swing varies also with the temperature in proportion to the temperature variation of $V_{BE}$.

This is very favorable to satisfying the operating condition of the gates of the present invention so that the logic swing should be smaller than $(V_{BE1} - V_{CES})$. That is to say, the operating point of the gate transistors when the 1 level is applied to the input can be kept in a state just before entering a deep saturation over a wide temperature range.

This source voltage regulator is further effective to the improvement of the production yield. In general the production spread of transistor characteristics is large. However, there is a property that the characteristics of the transistors in the same chip are so well matched that, when the $V_{BE}$ of the gate transistor varies with the producing condition, the output voltage of the source voltage regulator in the same chip will also vary in proportion to $V_{BE}$. Therefore, an optimum source voltage can be always fed to the gate.

In the logic circuit of the present invention, it is possible to use a combination of many kinds the gates mentioned above. In fabricating many kinds of integrated logic circuits, in order to reduce the production cost, there is adopted a so-called master slice system wherein the impurity diffusing process is carried out with the same mask and type are separated only in the final interconnection by using a metalizing technique. In order to form the logic circuit of the present invention as an integrated circuit, the master slice system is possible with such method as is shown as an example in FIG. 16.

As explained in the above, the logic circuit type of the present invention has remarkably improved the characteristics of any conventional circuit in operating speed and power dissipation, is very simple in the circuit configuration of the gate, is easy in the modification of the gate according to the intended use, is adapted to an increase in the integrated circuit density and is very effective as a circuit type for large-integrated circuits.

What is claimed is:

1. A high speed logic circuit, comprising: a number of unit logic gates, each of said unit logic gates comprising, a number of gate transistors having input terminals for receiving logic signals having a first logic level and a second logic level at their base electrodes and output terminals connected with their collector electrodes, a collector series resistor interconnecting said collector electrodes with the first terminal of a voltage source and an emitter series resistor interconnecting the emitter electrodes of said gate transistors with the second terminal of said voltage source, said collector series resistor having a resistance value higher than the sum of said emitter series resistance value and the incremental emitter junction resistance value of said gate transistors with an input signal exceeding the base-to-emitter voltage of said gate transistors applied to at least one of said input terminals; said voltage source having a voltage such that when said input signal is at said first logic level the voltage difference between said at least one input terminal and said second terminal of the voltage source is insufficient for the at least one of said gate transistors to which said input signal is applied to be switched to an active state from a non-conducting state and the collector current of said gate transistors being limited by said emitter series resistor when said input signal is at said second logic level so that the collector junction of said at least one gate transistor does not inject minority carriers; wherein the potential difference between said voltage source terminals is defined by the formulas $$V_1 - V_2 < V_{BEI} + V_L$$

$$V_L < V_{BEI} - V_{CES}$$

wherein $V_1$ is the voltage at said first voltage source terminal and $V_2$ is the voltage at said second voltage source terminal, $V_{BEI}$ is the base to emitter forward voltage of said gate transistors, $V_L$ is the logic swing of said gate transistors, $V_{CES}$ is the collector-emitter saturation voltage of said gate transistors and wherein said collector series resistor and said emitter series resistor are defined by $$1 < R_C/R_E + r_e < V_{BEI} - V_{CES}/V_1 - V_2 - V_{BEI}$$

wherein $R_C$ and $R_E$ are said collector and emitter series resistors, respectively, and $r_e$ is said incremental emitter junction resistance value; and wherein said high speed logic circuit is formed by directly coupling the output terminals of each of said logic gates to the input terminals of other of said logic gates whereby the signal levels at each of said input and output terminals of each of said logic gates are maintained at substantially constant binary values.

* * * * *

UNITED STATES PATENT OFFICE
CERTIFICATE OF CORRECTION

Patent No. 3,787,737 Dated January 22, 1974

Inventor(s) Hisakazu Mukai

It is certified that error appears in the above-identified patent and that said Letters Patent are hereby corrected as shown below:

[30] Foreign Application Priority

May 22, 1968 Japan No. 34023/43

Signed and sealed this 3rd day of September 1974.

(SEAL)
Attest:

McCOY M. GIBSON, JR.
Attesting Officer

C. MARSHALL DANN
Commissioner of Patents